(12) United States Patent
Yamashita et al.

(10) Patent No.: US 8,952,262 B2
(45) Date of Patent: Feb. 10, 2015

(54) COMPONENT-INCORPORATED WIRING SUBSTRATE AND METHOD OF MANUFACTURING THE SAME

(75) Inventors: Daisuke Yamashita, Komaki (JP); Kazunaga Higo, Iida (JP); Tetsuji Tsukada, Kitanagoya (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 135 days.

(21) Appl. No.: 13/599,326

(22) Filed: Aug. 30, 2012

(65) Prior Publication Data
US 2013/0048361 A1 Feb. 28, 2013

(30) Foreign Application Priority Data

Aug. 31, 2011 (JP) ................................. 2011-189169

(51) Int. Cl.
*H05K 1/16* (2006.01)
*H05K 1/09* (2006.01)
(Continued)

(52) U.S. Cl.
CPC .............. *H05K 1/185* (2013.01); *H01L 23/642* (2013.01); *H01L 23/49822* (2013.01);
(Continued)

(58) Field of Classification Search
USPC ................. 174/254, 257, 260, 261, 262–266; 361/760, 761, 763, 764; 29/830–832, 29/837, 845–846, 854
See application file for complete search history.

(56) References Cited

U.S. PATENT DOCUMENTS

| 7,350,296 | B2 * | 4/2008 | Ryu et al. .......................... 29/852 |
| 2006/0056162 | A1 * | 3/2006 | Koide ............................ 361/761 |

(Continued)

FOREIGN PATENT DOCUMENTS

| JP | 3522571 B2 | 4/2004 |
| JP | 4089902 B2 | 5/2008 |

(Continued)

OTHER PUBLICATIONS

Japanese Patent Office, Notification of Reason for Rejection issued in corresponding Japanese application No. 2011-189169, dispatched Jul. 8, 2014.

(Continued)

*Primary Examiner* — Timothy Thompson
*Assistant Examiner* — Sherman Ng
(74) *Attorney, Agent, or Firm* — Stites & Harbison PLLC; Jeffrey A. Haeberlin; Nicolo Davidson

(57) ABSTRACT

A component-incorporated wiring substrate is provided. Some embodiments include a plate-like component incorporated in a core substrate and a build-up layer having an insulation layer and a conductor layer disposed in alternating layers. The component has terminal electrodes formed at its opposite ends having a side surface and a main surface. An insulation layer disposed on the main surface of the component has via conductors formed therein which are connected to the side surfaces and the main surfaces of the respective terminal electrodes. The via conductors are tapered, such that their via diameter decreases in a direction toward the terminal electrode, and their via diameter at a position where they connect to the main surface is greater than a length of the main surface. Accordingly, the area of connection between the via conductors and the corresponding terminal electrodes is increased, improving connection reliability through enhancement of tolerance for positional deviation.

9 Claims, 6 Drawing Sheets

(51) Int. Cl.
*H05K 1/11* (2006.01)
*H05K 1/18* (2006.01)
*H05K 3/30* (2006.01)
*H01L 23/64* (2006.01)
*H01L 23/498* (2006.01)
*H05K 3/46* (2006.01)
*H05K 1/02* (2006.01)
*H01L 23/50* (2006.01)

(52) U.S. Cl.
CPC ..... *H05K 3/4602* (2013.01); *H05K 2201/0187* (2013.01); *H05K 2201/09827* (2013.01); *H05K 2201/09854* (2013.01); *H05K 2201/10015* (2013.01); *H05K 2201/10636* (2013.01); *H05K 2201/10734* (2013.01); *H05K 1/0231* (2013.01); *H05K 2203/1469* (2013.01); *H01L 2224/16225* (2013.01); *H01L 2924/15311* (2013.01); *H01L 23/49827* (2013.01); *H01L 23/50* (2013.01)
USPC ........... 174/260; 174/257; 174/262; 361/761; 361/763; 29/837

(56) References Cited

U.S. PATENT DOCUMENTS

| | | | |
|---|---|---|---|
| 2007/0195511 A1* | 8/2007 | Imamura et al. | 361/761 |
| 2007/0263369 A1* | 11/2007 | Takeuchi et al. | 361/760 |
| 2008/0047737 A1* | 2/2008 | Sahara et al. | 174/254 |
| 2008/0136013 A1* | 6/2008 | Kamiya et al. | 257/700 |
| 2009/0084596 A1* | 4/2009 | Inoue et al. | 174/261 |
| 2010/0212152 A1 | 8/2010 | Chiagawa et al. | |
| 2010/0214751 A1* | 8/2010 | Aoki et al. | 361/772 |
| 2012/0298728 A1 | 11/2012 | Sekimoto | |

FOREIGN PATENT DOCUMENTS

| | | |
|---|---|---|
| JP | 2009-289790 A | 12/2009 |
| WO | 2006/046461 A1 | 5/2006 |
| WO | 2010140335 A1 | 12/2010 |

OTHER PUBLICATIONS

Japanese Patent Office, Notification of Reason for Rejection, issued in Corresponding Japanese Application No. 2011-189169, dispatched Oct. 28, 2014.

* cited by examiner

COMPONENT-INCORPORATED WIRING SUBSTRATE AND METHOD OF MANUFACTURING THE SAME

CROSS REFERENCE TO RELATED APPLICATIONS

The present application claims priority from Japanese Patent Application No. 2011-189169, which was filed on Aug. 31, 2011, the disclosure of which is herein incorporated by reference in its entirety.

BACKGROUND OF THE INVENTION

1. Field of the Invention

The present invention relates to a wiring substrate having a built-in component (hereinafter referred to as a "component-incorporated wiring substrate") in which a plate-like component is incorporated.

2. Description of Related Art

A known package is configured as follows: build-up layers are formed on respective opposite sides of a core substrate so as to configure a wiring substrate, and an IC chip or a like device is mounted on the wiring substrate. In recent years, in association with an increase in speed and the number of terminals of IC chips, supply of power to the IC chip mounted on the wiring substrate from an external board involves a problem of malfunction caused by unstable supply voltage or noise. In order to cope with the problem, the wiring substrate incorporates a component, such as a capacitor, for stabilization of supply voltage or elimination of noise. For example, Patent Document 1 discloses a wiring substrate having a structure in which electronic circuit components are accommodated in respective holes of a base substrate, and terminals of the electronic circuit components are soldered to electrode pads of a wiring layer. By use of such a technique, there can be implemented, for example, a wiring substrate having a structure in which a chip capacitor is employed as a built-in electronic circuit component and connected to a supply voltage line. In the case of using the above-mentioned wiring substrate having build-up layers formed on respective opposite sides of the core substrate, after the chip capacitor is accommodated in an accommodation hole formed in the core substrate, via conductors are formed at predetermined positions in insulation layers, which are formed on the respective opposite sides of the core substrate and partially constitute the build-up layers, for electrically connecting the surfaces of terminal electrodes of the chip capacitor to upper and lower conductor layers.

RELATED ART DOCUMENTS

Patent Document 1 is Japanese Patent Application No. 2009-289790.

BRIEF SUMMARY OF THE INVENTION

Generally, a plate-like component to be built in a wiring substrate, such as a chip capacitor, has a pair of terminal electrodes at its opposite ends with respect to its longitudinal direction. Each of the terminal electrodes is formed in such a manner so as to extend on a corresponding side surface of the component between the top surface and the back surface of the component. Thus, each of the above-mentioned via conductors to be connected to the respective terminal electrodes of the component are formed in the corresponding insulation layer at a position which faces the corresponding terminal electrode in the direction of lamination. The lower end of the via conductor is in contact with the surface of the terminal electrode. However, in order to meet demand for reduction in size of the component, the terminal electrodes of the component are formed in very small sizes. Meanwhile, in order for the via conductors to be compatible with a high-density conductor pattern, the via conductors must be formed with a small via diameter. Accordingly, the via conductors having a small via diameter are connected to the terminal electrodes of a small size. Such a structure involves the following problem: in the manufacture of the wiring substrate, in a process of positioning the component in an accommodation hole, even a slight positional deviation may lead to a failure to maintain an electrical connection between the terminal electrodes and the via conductors. Also, the above-mentioned structure encounters difficulty in securing a sufficient connection area between the terminal electrodes and the via conductors, potentially resulting in an increase in DC resistance associated with connection of the component to a power supply line. As mentioned above, the conventional component-incorporated wiring substrate involves a problem of failure to ensure sufficient connection reliability between the built-in component and the via conductors.

The present invention has been conceived to solve the above problems, and an object of the invention is to provide a component-incorporated wiring substrate in which sufficient connection reliability is ensured in establishing connection of the built-in plate-like component by way of via conductors.

In order to achieve the above object, the present invention provides a component-incorporated wiring substrate in which a plate-like component is incorporated, comprising a component including a terminal electrode formed at an end with respect to a first direction, the terminal electrode having, as viewed in plane, a side surface and a main surface; an insulation layer and a conductor layer disposed in alternating layers on a side of the component corresponding to the main surface; and a first via conductor formed in the insulation layer disposed on the side of the component corresponding to the main surface, the first via conductor being connected to the side surface and the main surface of the terminal electrode; wherein the first via conductor is tapered such that the closer to the terminal electrode along a direction of lamination the smaller the via diameter of the first via conductor, and the via diameter of the first via conductor as measured in the first direction at a position where the first via conductor is connected to the main surface is greater than a length of the main surface of the terminal electrode as measured in the first direction.

According to the component-incorporated wiring substrate of the present invention, the built-in plate-like component has the terminal electrode formed at an end with respect to the first direction, and the first via conductor has a tapered shape, extends through the insulation layer disposed on the side of the component corresponding to the main surface, and is electrically connected to the terminal electrode. In this case, the via diameter of the first via conductor as measured at the same level as that of the main surface of the terminal electrode is greater than the length of the main surface of the terminal electrode along the first direction. Thus, by means of the first via conductor being formed at an appropriate position, the first via conductor can be connected not only to the main surface of the terminal electrode but also to the side surface of the terminal electrode, whereby DC resistance can be reduced through sufficient increase in connection area. Also, in the process of manufacturing the component-incorporated wiring substrate, tolerance for positional deviation of the component increases, so that connection reliability can be improved.

The first via conductor of the present invention can be freely disposed, so long as it is connected to the side surface and the main surface of the terminal electrode. However, for example, as viewed in plane, a center axis of the first via conductor may coincide with the side surface. Through employment of such disposition, when positional deviation of the component along the first direction arises, a reduction in connection area between the first via conductor and the terminal electrode can be restrained to a relatively low level.

No particular limitation is imposed on the structure of the component of the present invention. However, for example, the component may employ a structure in which a pair of the terminal electrodes is formed at respective opposite ends with respect to the first direction, the pair of the terminal electrodes each including respective side surfaces and main surfaces. By virtue of such a structure, the insulation layer includes a pair of the first via conductors formed in the insulation layer and that are connected to the side surfaces and the main surfaces of the respective pair of the terminal electrodes. A component having such a structure may be, for example, a chip capacitor.

The terminal electrode of the component of the present invention may include a first main surface and a second main surface which faces the first main surface in the direction of lamination. In this case, desirably, two first via conductors are formed symmetrically with respect to each other along the direction of lamination such that one first via conductor is formed in the insulation layer disposed on the side of the component corresponding to the first main surface and the other first via conductor is formed in the insulation layer disposed on the side of the component corresponding to the second main surface, and the first via conductors are formed in such a manner as to be connected to the side surface and to the first and second main surfaces, respectively, of the terminal electrode.

The shape and number of the first via conductors of the present invention can be freely determined. For example, the first via conductors can be disposed in a second direction that is different from the first direction. According to an example of such a structure, two first via conductors disposed in a direction orthogonal to the first direction may be connected to each of the terminal electrodes.

No particular limitation is imposed on the structure of the wiring substrate of the present invention, so long as the features of the present invention are yielded. For example, the insulation layer of the wiring substrate may have one or more second via conductors formed therein and not connected to the terminal electrode, and the first via conductor may be greater in via diameter than the second via conductor. Also, desirably, for example, the component of the present invention is accommodated in an open accommodation hole formed in a core substrate. However, the component of the present invention may be embedded in a resin insulation layer.

In order to achieve the above object, the present invention provides a method of manufacturing a component-incorporated wiring substrate in which a plate-like component is incorporated, comprising a component disposing step of preparing a component including, at its end, a terminal electrode including a side surface and a main surface, and disposing the component in a substrate, and a via conductor forming step of forming an insulation layer on a side of the component corresponding to the main surface, and forming in the insulation layer at a predetermined position a first via conductor which is connected to the side surface and the main surface of the terminal electrode, wherein the first via conductor is tapered such that the closer to the terminal electrode along a direction of lamination the smaller the via diameter of the first via conductor, and, as viewed in plane, the via diameter of the first via conductor as measured in a first direction at a position where the first via conductor is connected to the main surface is greater than a length of the main surface of the terminal electrode as measured in the first direction.

The component disposing step of the manufacturing method of the present invention may be as follows: a core substrate is prepared, an accommodation hole is formed in the core substrate, and the component is accommodated in the accommodation hole. By virtue of the component disposing step, build-up layers can be readily formed on respective opposite sides of the core substrate by means of, in the subsequent step, an insulation layer and a conductor layer being formed in alternating layers.

According to the present invention, since the first via conductor has a large via diameter, is formed for connection to the electrode terminal of a plate-like component incorporated in the wiring substrate, has a tapered shape, and is connected to both of the side surface and the main surface of the terminal electrode, there can be ensured a wide connection area which encompasses the area of connection to the side surface and the main surface of the terminal electrode. Therefore, DC resistance associated with connection between the first via conductor and the terminal electrode can be reduced, and large tolerance can be ensured for positional deviation of the component, whereby connection reliability can be enhanced in a comprehensive manner.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

A preferred embodiment of the present invention will next be described with reference to the drawings. However, the embodiment to be described below is a mere example of an application of the technical concept of the present invention. The contents of the embodiment should not be construed as limiting the invention.

Figure 1:
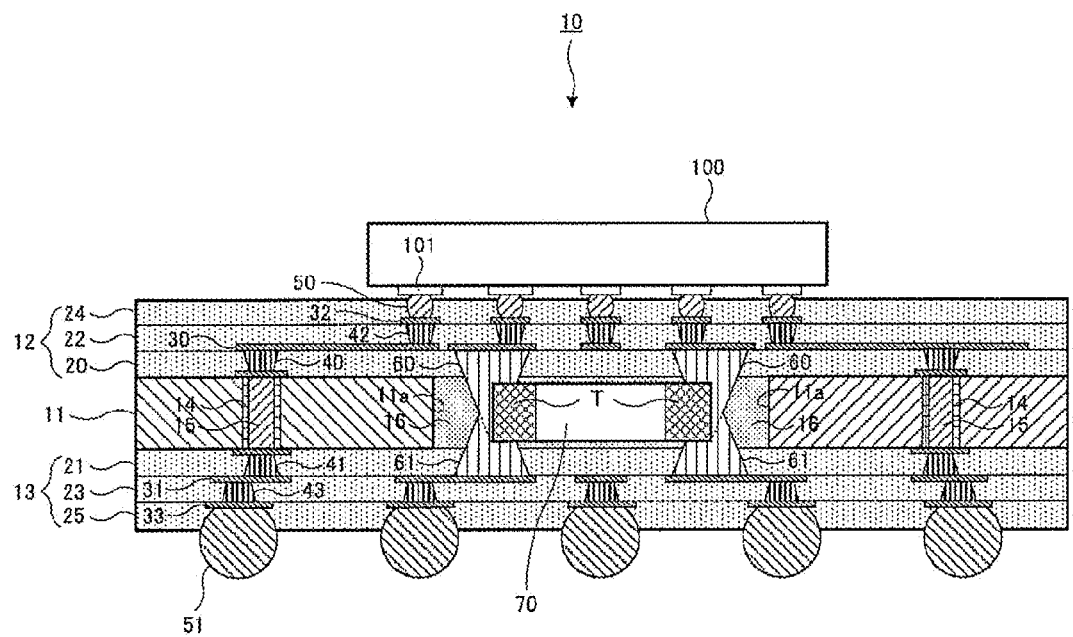
FIG. 1 is a schematic sectional view showing the structure of a wiring substrate of an embodiment of the present invention.

First, the structure of a component-incorporated wiring substrate according to an embodiment of the present invention will be described. FIG. 1 is a schematic sectional view showing the structure of a wiring substrate 10 having a built-in component (hereinafter referred to as "the wiring substrate 10") of the present embodiment. As shown in FIG. 1, the wiring substrate 10 of the present embodiment includes a core substrate 11 formed from, for example, an epoxy resin which contains glass fiber, a build-up layer 12 on a side toward the upper surface of the core substrate 11, and a build-up layer 13 on a side toward the lower surface of the core substrate 11. The wiring substrate 10 has a capacitor 70, which is a plate-like component, incorporated therein, and a semiconductor chip 100, which is a semiconductor device, mounted thereon. The capacitor 70 has a pair of terminal electrodes T provided at its respective opposite ends. The capacitor 70 is, for example, a chip capacitor for decoupling supply voltage to be supplied to the semiconductor chip 100. In this case, supply voltage may be connected to the positive pole of the capacitor 70 via one of the two terminal electrodes T, whereas the ground potential may be connected to the negative pole of the capacitor 70 via the other terminal electrode T. The specific structure of the capacitor 70 will be described later.

The core substrate 11 has an accommodation hole 11a which extends therethrough in a central region thereof and has a rectangular shape as viewed in plane. The chip-like capacitor 70 is accommodated in the accommodation hole 11a in an embedded condition. The core substrate 11 has a plurality of through-hole conductors 14 which extend therethrough in the direction of lamination in an outer peripheral region thereof. The through-hole conductors 14 are plugged with respective blocking bodies 15 formed from, for example, glass epoxy. Also, a gap between the capacitor 70 and the wall of the accommodation hole 11a is filled with a resin filler 16. The resin filler 16 is formed from, for example, a thermosetting resin and functions to absorb deformation of the capacitor 70 relative to the core substrate 11.

The build-up layer 12 is a laminate of a resin insulation layer 20 disposed above the core substrate 11, a resin insulation layer 22 disposed above the resin insulation layer 20, and a solder resist layer 24 disposed above the resin insulation layer 22. A conductor layer 30 is formed on the upper surface of the resin insulation layer 20. A plurality of terminal pads 32 are formed on the upper surface of the resin insulation layer 22. The resin insulation layer 20 has a plurality of via conductors 40 provided in an outer peripheral region thereof and adapted to establish electrical connection in the direction of lamination between the conductor layer 30 and upper-end electrodes of the through-hole conductors 14. Also, the resin insulation layer 20 has a pair of via conductors 60 (the first via conductors of the present invention) provided in a region thereof which faces the accommodation hole 11a, adapted to establish electrical connection in the direction of lamination between the conductor layer 30 and the terminal electrodes T of the capacitor 70, and having a via diameter greater than that of the via conductors 40. The role and structure of the via conductors 60 will be described later. Furthermore, the resin insulation layer 22 has a plurality of via conductors 42 provided at predetermined positions and adapted to establish electrical connection in the direction of lamination between the conductor layer 30 and a plurality of the terminal pads 32. The solder resist layer 24 has a plurality of openings where a plurality of the terminal pads 32 are exposed respectively. A plurality of solder bumps 50 are formed on the exposed terminal pads 32, respectively. The solder bumps 50 are connected to respective pads 101 of the semiconductor chip 100 mounted on the wiring substrate 10.

The other build-up layer 13 is a laminate of a resin insulation layer 21 disposed under the core substrate 11, a resin insulation layer 23 disposed under the resin insulation layer 21, and a solder resist layer 25 disposed under the resin insulation layer 23. A conductor layer 31 is formed on the lower surface of the resin insulation layer 21. A plurality of BGA pads 33 are formed on the lower surface of the resin insulation layer 23. The resin insulation layer 21 has a plurality of via conductors 41 provided in an outer peripheral region thereof and adapted to establish electrical connection in the direction of lamination between the conductor layer 31 and lower-end electrodes of the through-hole conductors 14. Also, the resin insulation layer 21 has a pair of via conductors 61 (the first via conductors of the present invention) provided in a region thereof which faces the accommodation hole 11a, adapted to establish electrical connection in the direction of lamination between the conductor layer 31 and the terminal electrodes T of the capacitor 70, and having a via diameter greater than that of the via conductors 41. These via conductors 41 and 61 are formed at positions corresponding to the via conductors 40 and 60, respectively, of the above-mentioned build-up layer 12. Furthermore, the resin insulation layer 23 has a plurality of via conductors 43 provided at predetermined positions and adapted to establish electrical connection in the direction of lamination between the conductor layer 31 and a plurality of the BGA pads 33. The solder resist layer 25 has a plurality of openings where a plurality of the BGA pads 33 are exposed respectively. A plurality of solder balls 51 are formed on the exposed BGA pads 33, respectively.

These solder balls 51 can be electrically connected to an external board (not shown).

Figure 2:
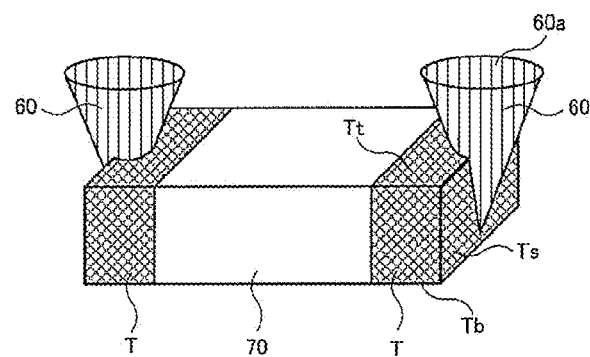
FIG. 2 is a perspective view showing, in an enlarged scale, a capacitor and a pair of via conductors in the structure of the wiring substrate shown in FIG. 1.

FIG. 2 is a perspective view showing, in an enlarged scale, the capacitor 70 and a pair of the via conductors 60 in the structure of the wiring substrate 10 of FIG. 1. For easy understanding, FIG. 2 shows an upper pair of the via conductors 60 of the capacitor 70 and eliminates the illustration of a lower pair of the via conductors 61 of the capacitor 70. As shown in FIG. 2, the capacitor 70 has a pair of the terminal electrodes T provided, as viewed in plane, at respective opposite ends thereof with respect to the longitudinal direction of a rectangle. Each of the terminal electrodes T includes a top surface Tt (the first main surface of the present invention), a side surface Ts, and a back surface Tb (the second main surface of the present invention).

Each of the via conductors 60 is formed into a tapered shape such that an upper end surface 60a in contact with the conductor layer 30 has the greatest via diameter and such that the via diameter reduces in the downward direction. The via conductors 60 are electrically connected to not only the top surfaces Tt but also the side surfaces Ts of the terminal electrodes T, respectively. In the example of FIG. 2, the via conductors 60 are disposed such that the center axes thereof coincide with the centers of the side surfaces Ts of the terminal electrodes T, respectively. In this case, a connection region between each of the via conductors 60 and the corresponding terminal electrode T encompasses a semicircular region of the top surface Tt and a triangular region of the side surface Ts, thereby securing a sufficiently wide overall connection area. A pair of the terminal electrodes T and a pair of the via conductors 60 are disposed symmetrically relative to each other along the longitudinal direction of the capacitor 70.

An unillustrated lower pair of the via conductors 61 is disposed symmetrically with respect to an upper pair of the via conductors 60 along the direction of lamination. That is, the via conductors 61 are electrically connected to the back surfaces Tb and the side surfaces Ts of the terminal electrodes T, respectively. However, the present invention can also be applied to the case where either an upper pair of the via conductors 60 or a lower pair of the via conductors 61 is provided, in addition to the case where both an upper pair of the via conductors 60 and a lower pair of the via conductors 61 are provided. For example, while an upper pair of the via conductors 60 is provided, a pair of pads may be provided immediately under a pair of the respective terminal electrodes T and soldered to the pair of the respective terminal electrodes T.

Figure 3:
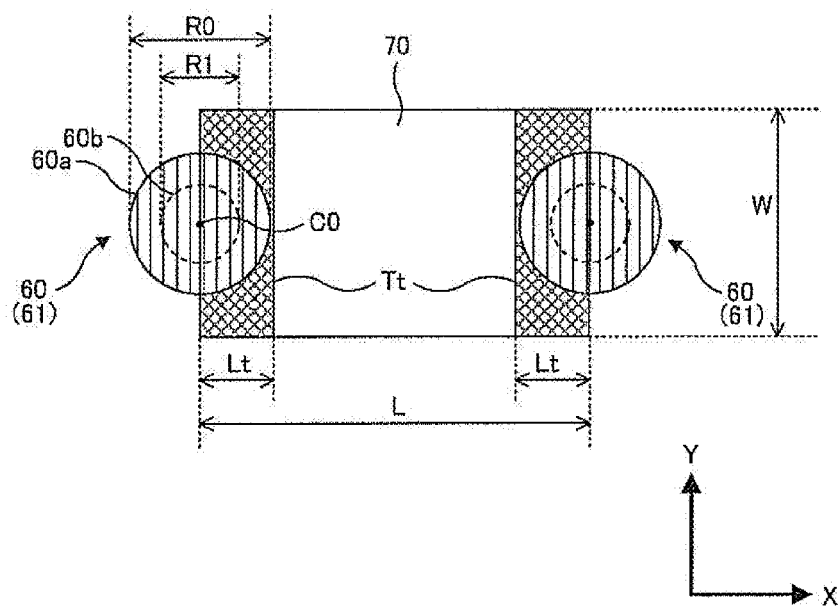
FIG. 3 is a view showing a planar structure, as viewed from above, which encompasses the capacitor and the via conductors in the embodiment.
Figure 4:
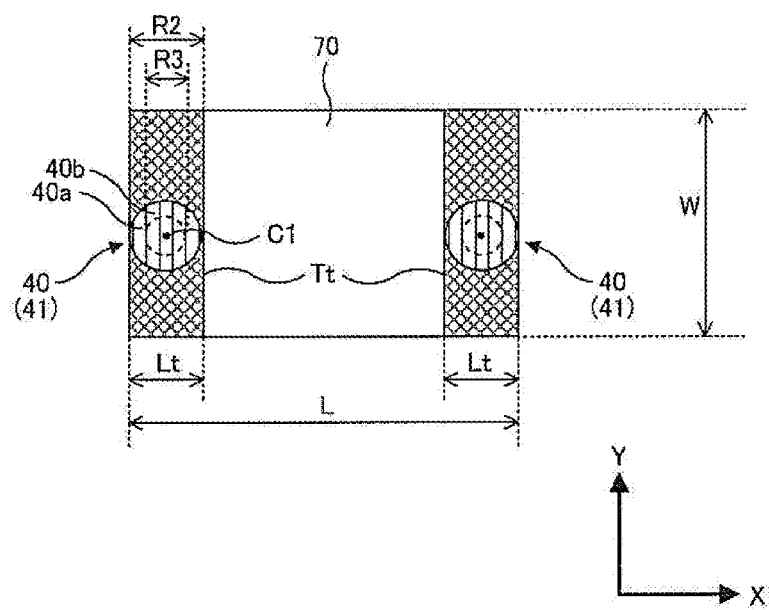
FIG. 4 is a view showing a planar structure with via conductors smaller in via diameter than the via conductors shown in FIG. 3.

Next, effects stemming from dimensional conditions and structure of the via conductors 60 and 61 of the present embodiment shown in FIG. 2 will be described with reference to FIGS. 3 and 4. FIG. 3 shows, as an example, a planar structure, as viewed from above, which encompasses the capacitor 70 and the via conductors 60 (61). FIG. 4 shows, as a comparative example for comparison with FIG. 3, a planar structure in which the via conductors 60 (61) are replaced with the via conductors 40 (41) smaller in via diameter than the via conductors 60 (61). For convenience sake, FIGS. 3 and 4 show the X and Y directions of rectangular coordinates. The X direction (the first direction in the present invention) corresponds to the horizontal direction in FIG. 1. The Y direction corresponds to the direction perpendicular to and directed toward the far side of FIG. 1.

First, in the present embodiment, as shown in FIG. 3, the plate-like capacitor 70 has, as viewed in plane, a length L along the X direction, or the longitudinal direction, and a width W along the Y direction. Specifically, the capacitor 70 has, for example, a length L of 1.0 mm and a width W of 0.5 mm. The terminal electrodes T are formed at respective opposite ends, with respect to the X direction, of the capacitor 70 and each have a length Lt along the X direction and the width W along the Y direction. FIG. 3 shows the top surfaces Tt of the terminal electrodes T. As mentioned above, the via conductors 60 are tapered along the direction of lamination; i.e., have a conical shape such that the diameter of a circular cross section reduces along a downward direction. Thus, the upper end surface 60a of each via conductor 60 has a greatest via diameter R0, and a cross section 60b thereof at the same level as that of the top surface Tt of the terminal electrode T has a via diameter R1 smaller than the via diameter R0. That is, the relation R0>R1 is satisfied. In the example of FIG. 3, similar to FIG. 2, center axes C0 of the via conductors 60 connected to the respective terminal electrodes T coincide, at the center of the width W, with ends (the side surfaces Ts) of the terminal electrodes T, respectively.

In the structure of FIG. 3, the via diameter R1 of the cross section 60b of each via conductor 60 is set slightly greater than the length Lt of the top surface Tt of the terminal electrode T. In order to secure a sufficient connection area between the via conductor 60 and the terminal electrode T, the present embodiment is characterized in that the dimensional relation R1>Lt is satisfied. Through employment of such an increased size of the via conductor 60 as to satisfy the dimensional relation, a sufficient connection area can be secured for connection of the via conductor 60 to the top surface Tt and to the side surface Ts of the terminal electrode T. For the lower via conductors 61, a similar dimensional relation may be set while the top surface Tt of the terminal electrode T is replaced with the back surface Tb of the terminal electrode T. Notably, even when the relation R1>Lt is satisfied, employment of an excessively large via diameter R1 may cause an electrical short circuit between the paired via conductors 60 or an increase in the size of the accommodation hole 11a. Therefore, an appropriate upper limit must be imposed on the via diameter R1.

By contrast, the structure of FIG. 4 is similar to that of FIG. 3 in that each of the via conductors 40 is formed into a tapered shape, but differs in that the size of the via conductor 40 is substantially half that of the via conductor 60. Also, the center axes C1 of the via conductors 40 coincide with the centers of the terminal electrodes T (the centers of the lengths Lt and the center of the width W), respectively. An upper end surface 40a of each via conductors 40 has a greatest via diameter R2, and a cross section 40b thereof at the same level as that of the top surface Tt of the terminal electrode T has a via diameter R3 smaller than the via diameter R2 (R2>R3). In this case, in FIG. 4, different from FIG. 3, since the via diameter R3 is smaller than the length Lt of the top surface Tt of the terminal electrode T, the connection area between the via conductor 40 and the top surface Tt is small. Furthermore, since the via conductor 40 is not connected at all to the side surface Ts of the terminal electrode T, the overall connection area becomes far smaller.

In FIGS. 3 and 4, let us assume that, in mounting the capacitor 70, the capacitor 70 positionally deviates in the X direction relative to the via conductors 60 and 40. Upon such a positional deviation in the X direction, the structure of FIG. 4 suffers a drastic reduction in the connection area between the via conductors 40 and the respective terminal electrodes T, whereas, in the structure of FIG. 3, a reduction in the connection area between the via conductors 60 and the respective terminal electrodes T is relatively mild. This is a favorable effect stemming from the structural features including, as mentioned above, via conductors 60 with a large via diameter, and each of the via conductors 60 being connected to both of the top surface Tt and the side surface Ts of the terminal electrode T. As mentioned above, employment of the structure of FIG. 3 yields the effect of reducing DC resistance through increasing the connection area between the via conductors 60 and the respective terminal electrodes T, and the effect of enhancing tolerance for positional deviation of the capacitor 70.

Figure 5:
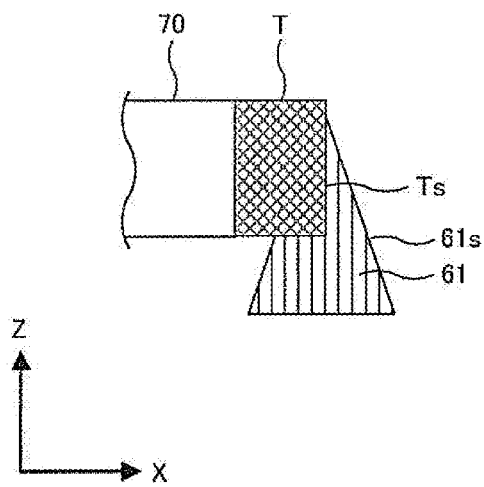
FIG. 5 is a schematic view showing the sectional structure of a connection between the capacitor and the lower via conductor in the embodiment.
Figure 6:
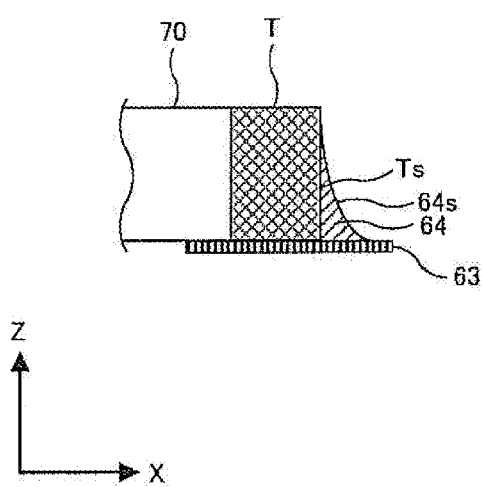
FIG. 6 is a view showing the sectional structure of an electrical connection formed by use of a lower pad and a fillet solder in the place of the via conductor shown in FIG. 5.

Other effects yielded by the structure of the present embodiment will next be described with reference to FIGS. 5 and 6. FIG. 5 schematically shows the sectional structure of a connection between the capacitor 70 of FIG. 2 and the lower via conductor 61. For contrast to FIG. 6, FIG. 5 eliminates the illustration of the upper via conductor 60. FIG. 6 shows, as a comparative example, the sectional structure of an electrical connection which is implemented by use of a lower pad 63 and a fillet solder 64 in place of the via conductor 61 of FIG. 5. For convenience sake, FIGS. 5 and 6 show the X direction (similar to that of FIGS. 3 and 4) and the Z direction (the direction of lamination) of rectangular coordinates.

First, in the present embodiment, as mentioned above, the via conductor 61, whose via diameter increases along the downward direction, is connected to the terminal electrode T of the capacitor 70. Thus, the via conductor 61, which overlaps the side surface Ts of the terminal electrode T, has a side surface 61s which is flat as viewed on a section of the via conductor 61. By contrast, in the comparative example of FIG. 6, the pad 63 is disposed under the terminal electrode T, and an outer peripheral portion of the pad 63 and the side surface Ts of the terminal electrode T are joined by means of the solder 64. Thus, the solder 64 has a fillet shape and has a side surface 64s which is concaved as viewed on its section. That is, in comparison with the via conductor 61 having the flat side surface 61s as shown in FIG. 5, although the side surface 64s of the solder 64 in FIG. 6 is shaped such that the thickness of the solder 64 reduces along the upward direction similar to the via conductor 61, the thickness reduces to a greater extent. As a result, as compared with the structure of FIG. 6, the structure of FIG. 5 of the present embodiment has the advantage in resistance to a bending stress imposed on a region in the vicinity of the accommodation hole 11a of the wiring substrate 10. Therefore, connection reliability can be further improved.

Figure 7:
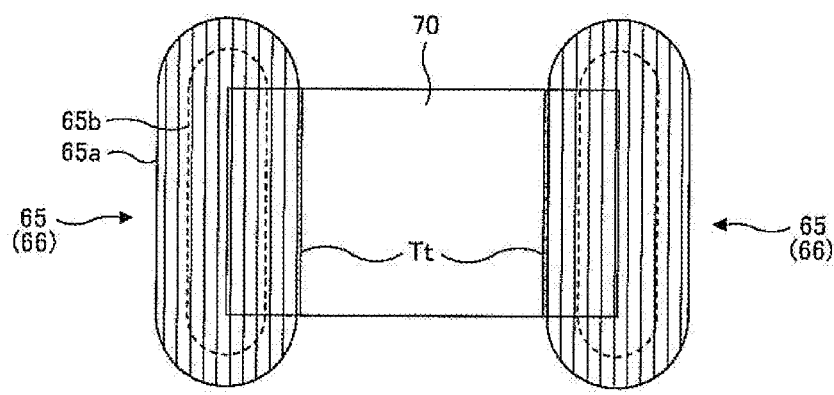
FIG. 7 is a view showing a first modification which uses via conductors different in shape from the via conductors shown in FIG. 3.

The characteristic structure of the present invention has been described above, but the structure is a mere example. The present invention can be applied to the following modified structures. FIG. 7 shows a first modification which uses via conductors 65 different in shape from the via conductors 60 of FIG. 3 for increasing the connection area between the via conductors 60 (61) and the respective terminal electrodes T. In the first modification, in contrast to the via conductors 60 (61) each having a circular cross section as shown in FIG. 3, the via conductors 65 (and lower via conductors 66) each have a cross section which has a size similar to that of FIG. 3 along the direction of the length Lt of the terminal electrode T and an extended size along the direction of the width W of the terminal electrode T. That is, the via conductors 65 of FIG. 7 each have a cross section consisting of arcs and straight lines (an upper end surface 65a, and a cross section 65b taken at the same level as that of the top surface Tt), rather than a circular cross section in FIG. 3. The via conductors 65 in FIG. 7 may each have an elliptic cross section. As compared with the embodiment of FIG. 3, the first modification can further increase the connection area between the via conductors 65 and the respective terminal electrodes T.

Figure 8:
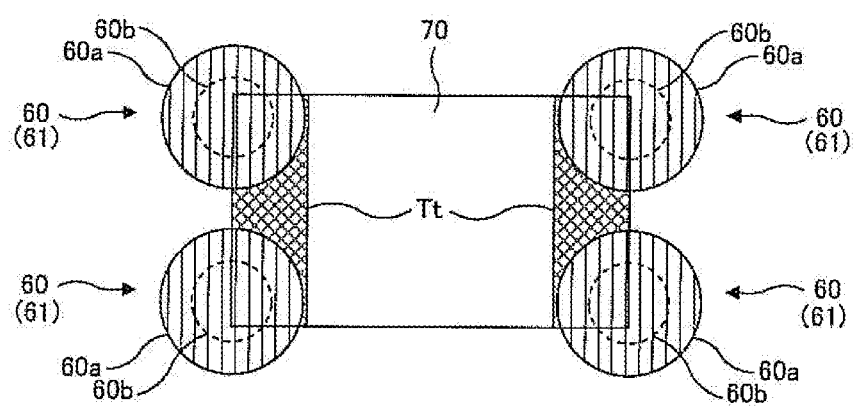
FIG. 8 is a view showing a second modification in which two via conductors shown in FIG. 3 are provided for each terminal electrode.

FIG. 8 shows a second modification in which two via conductors 60 (61) of FIG. 3 are provided for each of the terminal electrodes T for increasing the connection area between the via conductors 60 (61) and the respective terminal electrodes T. In the second modification, the two via conductors 60 (61) are disposed at respective opposite ends, with respect to the direction of the width W (FIG. 3), of each of the terminal electrodes T. The two via conductors 60 each have the same sectional shape and size as those of the via conductor 60 of FIG. 3. Similar to FIG. 3, the center axes C0 (FIG. 3) of the two via conductors 60 coincide with the side surface Ts. Thus, in the second modification, since a total of four via conductors 60 and 61 can be connected to a single terminal electrode T along the vertical direction of the terminal electrode T, a connection area can be doubled as compared with the structure of FIG. 3.

Figure 9:
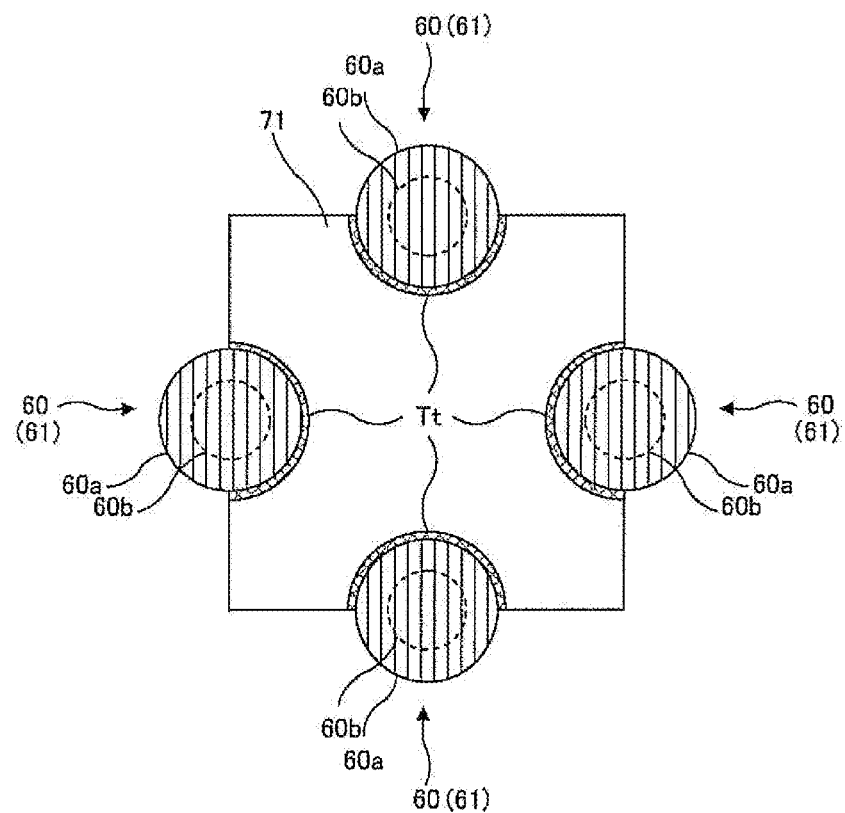
FIG. 9 is a view showing a third modification in which, in place of the capacitor of the embodiment, a four-terminal component is accommodated in an accommodation hole.

Furthermore, FIG. 9 shows a third modification in which, in place of the capacitor 70 of the present embodiment, a four-terminal component 71 is accommodated in the accommodation hole 11a. The component 71 of FIG. 9 has a square shape as viewed in plane and has four terminal electrodes T at its four sides, respectively. In FIG. 9, only the semicircular top surface Tt of each of the terminal electrodes T appears; however, although unillustrated, each of the terminal electrodes T further has a rectangular side surface Ts and a semicircular back surface Tb. The via conductors 60 (61) each have the same sectional shape and size as those of the via conductor 60 (61) of FIG. 3. Similar to FIG. 3, the center axes C0 (FIG. 3) of the via conductors 60 (61) coincide with the side surfaces Ts, respectively, at the centers of the sides of the square. In the third modification, the four-terminal component 71 may be a capacitor or any other component, such as a ferrite bead. In this manner, in the wiring substrate 10 of the present invention, no particular limitation is imposed on the type of and the number of terminals of a component to be accommodated in the accommodation hole 11a, so long as the via conductors 60 (61) have the structural features of the invention.

Figure 10:
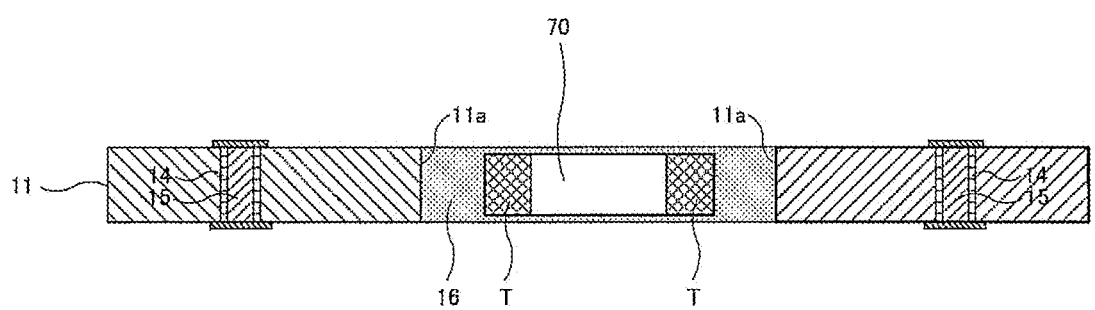
FIG. 10 is a view showing a first sectional structure showing a method of manufacturing the wiring substrate of the embodiment.

Next, a method of manufacturing the wiring substrate 10 of the present embodiment will be briefly described. First, as shown in FIG. 10, the core substrate 11 is prepared, and the core substrate 11 has a through-hole which is formed beforehand in its central region by use of a router and will become the accommodation hole 11a. The capacitor 70 is accommodated in the accommodation hole 11a and then temporarily fixed by a known method. Subsequently, the resin filler 16 of a thermosetting resin is charged into the gap between the capacitor 70 and the wall of the accommodation hole 11a. Then, the resin filler 16 is set through application of heat, thereby fixing the capacitor 70 in the accommodation hole 11a. Meanwhile, by use of a drilling machine, through-holes are formed in the core substrate 11 at predetermined positions. The through-holes are subjected to copper plating, thereby forming the through-hole conductors 14. Subsequently, paste is charged, by printing, into the through-hole conductors 14, followed by setting to form the blocking bodies 15.

Figure 11:
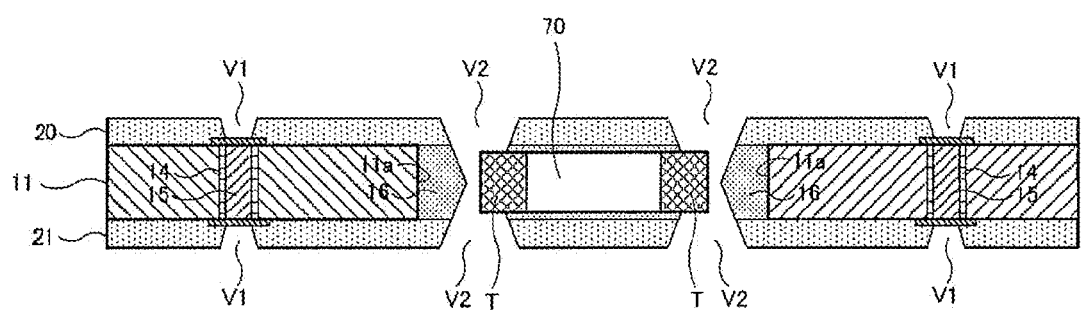
FIG. 11 is a view showing a second sectional structure showing the method of manufacturing the wiring substrate of the embodiment.

Then, as shown in FIG. 11, a film of an insulation resin material which contains epoxy resin as a main component is laminated on each of the upper and lower surfaces of the core substrate 11. Then, the insulation resin material is set through application of pressure and heat under a vacuum, thereby forming the resin insulation layer 20 on the upper side, and the resin insulation layer 21 on the lower side. The surfaces of the resin insulation layers 20 and 21 are subjected to laser beam machining at positions corresponding to the through-hole conductors 14, thereby forming a plurality of via holes V1, as well as at positions corresponding to the two terminal electrodes T at opposite ends of the capacitor 70, thereby forming two via holes V2. At this time, the via holes V1 and V2 are tapered according to respective laser intensity distributions. Also, as mentioned above, the via holes V2 have a diameter greater than that of the via holes V1 (e.g., two times greater), and extend through the resin filler 16 in the vicinity of the terminal electrodes T. In this case, generally, the via hole diameter depends on the number of shots in laser radiation; thus, the number of shots in laser beam machining for forming the via holes V2 must be adjusted to about two times that in laser beam machining for forming the via holes V1.

Figure 12:
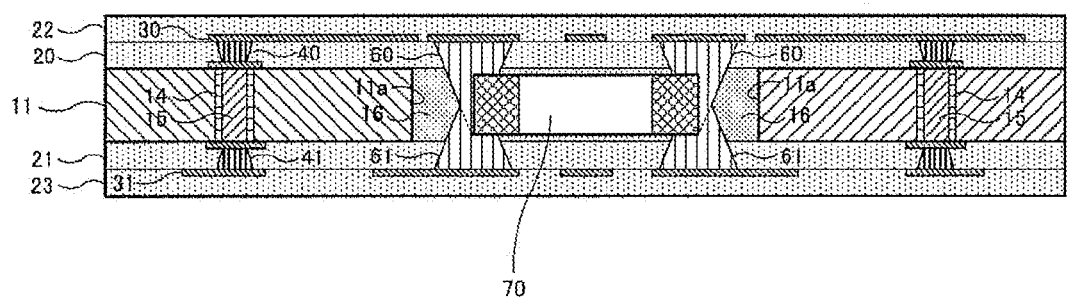
FIG. 12 is a view showing a third sectional structure showing the method of manufacturing the wiring substrate of the embodiment.

Then, after a desmearing process is performed for removing smear from inside the via holes V1 and V2, as shown in FIG. 12, copper plating is performed in the via holes V1 so as to form the via conductors 40 and 41, and copper plating is performed in the via holes V2 so as to form the via conductors 60 and 61. Subsequently, patterning is performed on the surfaces of the resin insulation layers 20 and 21, thereby forming the conductor layers 30 and 31 of copper. Next, the above-mentioned film of an insulation resin material is laminated on the upper surface of the resin insulation layer 20 and on the lower surface of the resin insulation layer 21. Then, the insulation resin material is set through application of pressure and heat under a vacuum, thereby forming the resin insulation layers 22 and 23.

Then, referring back to FIG. 1, the via conductors 42 and 43 are formed in the resin insulation layers 22 and 23, respectively, by a method similar to the above-mentioned method used to form the via conductors 40 and 41. Subsequently, a plurality of the terminal pads 32 are formed on the upper surface of the resin insulation layer 22, and a plurality of the BGA pads 33 are formed on the lower surface of the resin insulation layer 23. Next, a photosensitive epoxy resin is applied to the upper surface of the resin insulation layer 22 and to the lower surface of the resin insulation layer 23, followed by curing for forming the solder resist layers 24 and 25. Subsequently, openings are formed in the solder resist layer 24 by patterning, and a plurality of the solder bumps 50 are formed in the respective openings for connection to a plurality of the terminal pads 32, respectively. Also, openings are formed in the solder resist layer 25 by patterning, and a plurality of the solder balls 51 are formed in the respective openings for connection to a plurality of the BGA pads 33, respectively. By the procedure mentioned above, the wiring substrate 10 of the present embodiment is completed.

The wiring substrate 10 of the present embodiment is described while mentioning the via conductors 40 to 43, 60, and 61 in the form of filled vias, which are through-holes filled with a conductor. However, the present invention can also be applied to the case where the via conductors 40 to 43, 60, and 61 are in the form of conformal vias, which are through-holes whose walls are plated with a conductor.

The wiring substrate 10 of the present embodiment is described while mentioning that the via conductors 40 to 43 have a relatively small via diameter and the via conductors 60 and 61 have a relatively large via diameter. However, all the via conductors 40 to 43, 60, and 61 may also be increased in via diameter, so long as the requirement regarding pattern density in a region where the via conductors 40 to 43 are connected is satisfied. Furthermore, the wiring substrate 10 of the present embodiment is described while mentioning accommodation of a component in the accommodation hole 11a formed in the core substrate 11. However, the structure of the present invention may be applied to, for example, accommodation of a component in a vacant space of a resin insulation layer.

While the present invention has been described with reference to the above embodiment, the present invention is not limited thereto, but may be modified in various other forms without departing from the gist of the invention. For example, the present embodiment is described while mentioning application of the present invention to the wiring substrate 10 on which the semiconductor chip 100 is mounted. However, the present invention can be applied to the wiring substrate 10 on which a component other than the semiconductor chip 100 is mounted, so long as the structural features of the present invention are employed. Also, other features of the above embodiment should not be construed as limiting the present invention, and the above embodiment may be modified as appropriate, so long as a modified embodiment yields the actions and effects of the present invention.

DESCRIPTION OF REFERENCE NUMERALS

10: wiring substrate having built-in component
11: core substrate
11a: accommodation hole
12, 13: build-up layer
14: through-hole conductor
15: blocking body
16: resin filler
20, 21, 22, 23: resin insulation layer
24, 25: solder resist layer
30, 31: conductor layer
32: terminal pad
33: BGA pad
40, 41, 42, 43, 60, 61, 65, 66: via conductor
50: solder bump
51: solder ball
64: solder
70: capacitor
71: component
100: semiconductor chip
T: terminal electrode

What is claimed is:

1. A component-incorporated wiring substrate in which a plate-like component is incorporated, comprising:
    a component including a terminal electrode formed at an end with respect to a first direction, the terminal electrode having, as viewed in plane, a side surface and a main surface;
    an insulation layer and a conductor layer disposed in alternating layers on a side of the component corresponding to the main surface; and
    a first via conductor formed in the insulation layer disposed on the side of the component corresponding to the main surface, the first via conductor being connected to the side surface and the main surface of the terminal electrode; wherein
    the first via conductor is tapered such that the closer to the terminal electrode along a direction of lamination the smaller the via diameter of the first via conductor,
    the via diameter of the first via conductor as measured in the first direction at a position where the first via conductor is connected to the main surface is greater than a length of the main surface of the terminal electrode as measured in the first direction
    the terminal electrode includes a first main surface and a second main surface which faces the first main surface in the direction of lamination,
    the insulation layer and the conductor layer are disposed in alternating layers on a side of the component corresponding to the first main surface and on a side of the component corresponding to the second main surface, and
    the first via conductor formed in the insulation layer disposed on the side of the component corresponding to the first main surface and the first via conductor formed in the insulation layer disposed on the side of the component corresponding to the second main surface are disposed symmetrically with respect to each other along the direction of lamination.

2. A component-incorporated wiring substrate according to claim 1, wherein, as viewed in plane, a center axis of the first via conductor coincides with the side surface of the terminal electrode.

3. A component-incorporated wiring substrate according to claim 1, wherein:
    the component includes a pair of the terminal electrodes formed at respective opposite ends with respect to the first direction, the pair of the terminal electrodes each including respective side surfaces and main surfaces, and
    the insulation layer includes a pair of the first via conductors formed therein and connected to the side surfaces and the main surfaces of the respective pair of the terminal electrodes.

4. A component-incorporated wiring substrate according to claim 3, wherein the component is a capacitor.

5. A component-incorporated wiring substrate according to claim 1, wherein the first via conductor is disposed in a second direction that is different from the first direction.

6. A component-incorporated wiring substrate according to claim 1, wherein
the insulation layer includes one or more second via conductors formed therein and not connected to the terminal electrode, and
the first via conductor is greater in via diameter than the second via conductor.

7. A component-incorporated wiring substrate according to claim 1, wherein the component is accommodated in an open accommodation hole formed in a core substrate.

8. A method of manufacturing the component-incorporated wiring substrate in which a plate-like component is incorporated according to claim 1, comprising:
a component disposing step of preparing a component including, at its end, a terminal electrode including a side surface and a main surface, and disposing the component in a substrate, and
a via conductor forming step of forming an insulation layer on a side of the component corresponding to the main surface, and forming in the insulation layer at a predetermined position a first via conductor which is connected to the side surface and the main surface of the terminal electrode; wherein
the first via conductor is tapered such that the closer to the terminal electrode along a direction of lamination the smaller the via diameter of the first via conductor, and
the via diameter of the first via conductor as measured in a first direction at a position where the first via conductor is connected to the main surface is greater than a length of the main surface of the terminal electrode as measured in the first direction.

9. A method of manufacturing a component-incorporated wiring substrate according to claim 8, wherein, in the component disposing step, a core substrate is prepared, an accommodation hole is formed in the core substrate, and the component is accommodated in the accommodation hole.

* * * * *